United States Patent
Ohtani

[19]

[11] Patent Number: 5,869,362
[45] Date of Patent: *Feb. 9, 1999

[54] METHOD OF MANUFACTURING SEMICONDUCTOR DEVICE

[75] Inventor: Hisashi Ohtani, Kanagawa, Japan

[73] Assignee: Semiconductor Energy Laboratory Co., Ltd., Kanagawa, Japan

[ * ] Notice: This patent issued on a continued prosecution application filed under 37 CFR 1.53(d), and is subject to the twenty year patent term provisions of 35 U.S.C. 154(a)(2).

[ * ] Notice: The term of this patent shall not extend beyond the expiration date of Pat. No. 5,585,291.

[21] Appl. No.: 544,004

[22] Filed: Oct. 17, 1995

Related U.S. Application Data

[63] Continuation-in-part of Ser. No. 350,114, Nov. 29, 1994, Pat. No. 5,585,291.

[30] Foreign Application Priority Data

Dec. 2, 1993 [JP] Japan ..................................... 5-339397
Oct. 20, 1994 [JP] Japan ..................................... 6-281408

[51] Int. Cl.$^6$ .................................................... H01L 21/84
[52] U.S. Cl. ................... 438/166; 438/487; 148/DIG. 16
[58] Field of Search ................................. 257/66, 70, 72, 257/75; 437/21, 40 TFT, 41 TFT, 88, 101, 233, 967; 148/DIG. 16; 438/166, 308, 487

[56] References Cited

U.S. PATENT DOCUMENTS

| | | | |
|---|---|---|---|
| 3,108,914 | 10/1963 | Hoerni | ..................................... 437/142 |
| 3,389,024 | 6/1968 | Schimmer . | |
| 3,783,049 | 1/1974 | Sandera | ..................................... 437/159 |
| 3,873,384 | 3/1975 | Chang . | |

(List continued on next page.)

FOREIGN PATENT DOCUMENTS

| | | |
|---|---|---|
| 55-59762 | 5/1980 | Japan . |
| 55-121653 | 9/1980 | Japan . |
| 1-206632 | 8/1989 | Japan . |
| 2-140915 | 5/1990 | Japan . |
| 6-268212 | 9/1994 | Japan . |
| 7-66195 | 3/1995 | Japan . |

OTHER PUBLICATIONS

C. Hayzelden et al., "*In Situ* Transmission Electron Microscopy Studies of Silicide–Mediated Crystallization of Amorphous Silicon" Appl. Phys. Lett. 60(2) (1992) 225.

A.V. Dvurechenskii et al., "Transport Phenomena in Amorphous Silicon Doped by Ion Implantation of 3d Metals", Phys. Stat. Sol. A95(1986) 635.

(List continued on next page.)

*Primary Examiner*—Kevin Picardat
*Assistant Examiner*—Leon Radomsky
*Attorney, Agent, or Firm*—Sixbey, Friedman, Leedom & Ferguson; Gerald J. Ferguson, Jr.; Jeffrey L. Costellia

[57] ABSTRACT

Thin-film transistors each having a different characteristic are selectively formed on the same substrate. A silicon oxide film, an amorphous silicon film, a barrier film for preventing the diffusion of a nickel element and an oxide film containing a nickel element that promotes the crystallization of silicon are sequentially formed on a glass substrate. The oxide film containing the nickel element is patterned and subjected to a heat treatment, to thereby crystallize the amorphous silicon film under the oxide film whereas the amorphous silicon film from which the oxide film has been removed remains as it is. After the heat treatment has been conducted, a laser light is irradiated on those films. On the silicon film which has been crystallized by heating, a laser light is irradiated in a state where even a necessary energy density is attenuated after the laser light transmits the oxide film, thereby promoting the crystalline property. On the other hand, on the silicon film that remains amorphous in the heat treatment, a laser beam is directly irradiated so as to be crystallized. As a result, two kinds of crystalline silicon films different in crystallizing process is obtained.

70 Claims, 3 Drawing Sheets

U.S. PATENT DOCUMENTS

| | | |
|---|---|---|
| 3,886,569 | 5/1975 | Basi et al. . |
| 3,988,762 | 10/1976 | Cline et al. ............................. 437/159 |
| 4,090,915 | 5/1978 | Keller ..................................... 437/164 |
| 4,091,527 | 5/1978 | Goodman et al. ..................... 437/164 |
| 4,110,488 | 8/1978 | Risko ..................................... 437/175 |
| 4,481,121 | 11/1984 | Zhang et al. . |
| 4,619,719 | 10/1986 | Thomas et al. ......................... 437/164 |
| 5,147,826 | 9/1992 | Liu et al. ................................ 437/233 |
| 5,275,851 | 1/1994 | Fonash et al. .......................... 437/233 |
| 5,403,772 | 4/1995 | Zhang et al. . |
| 5,426,064 | 6/1995 | Zhang et al. . |
| 5,488,000 | 1/1996 | Zhang et al. . |
| 5,492,843 | 2/1996 | Adachi et al. . |
| 5,501,989 | 3/1996 | Takayama et al. . |
| 5,508,533 | 4/1996 | Takemura . |
| 5,529,937 | 6/1996 | Zhang et al. . |
| 5,534,716 | 7/1996 | Takemura . |
| 5,543,352 | 8/1996 | Ohtani et al. . |
| 5,563,426 | 10/1996 | Zhang et al. . |
| 5,569,610 | 10/1996 | Zhang et al. ............................. 437/21 |
| 5,569,936 | 10/1996 | Zhang et al. ............................. 257/66 |
| 5,580,792 | 12/1996 | Zhang et al. . |
| 5,585,291 | 12/1996 | Ohtani et al. ..................... 437/40 TFT |
| 5,589,694 | 12/1996 | Takayama et al. . |
| 5,595,923 | 1/1997 | Zhang et al. . |
| 5,595,944 | 1/1997 | Zhang et al. . |
| 5,604,360 | 2/1997 | Zhang et al. . |
| 5,605,846 | 2/1997 | Ohtani et al. . |
| 5,606,179 | 2/1997 | Yamazaki et al. . |
| 5,608,232 | 3/1997 | Yamazaki et al. ........................ 257/66 |
| 5,612,250 | 3/1997 | Ohtani et al. . |
| 5,614,426 | 3/1997 | Funada et al. . |
| 5,614,733 | 3/1997 | Zhang et al. . |
| 5,616,506 | 4/1997 | Takemura . |
| 5,620,910 | 4/1997 | Teramoto . |
| 5,621,224 | 4/1997 | Yamazaki et al. . |
| 5,624,851 | 4/1997 | Takayama et al. . |
| 5,637,515 | 6/1997 | Takemura . |
| 5,639,698 | 6/1997 | Yamazaki et al. . |
| 5,643,826 | 7/1997 | Ohtani et al. . |
| 5,646,424 | 7/1997 | Zhang et al. . |
| 5,654,203 | 8/1997 | Ohtani et al. . |
| 5,656,825 | 8/1997 | Kusumoto et al. . |
| 5,663,077 | 9/1997 | Adachi et al. . |
| 5,677,549 | 10/1997 | Takayama et al. . |
| 5,700,333 | 12/1997 | Yamazaki et al. . |
| 5,705,829 | 1/1998 | Miyanaga et al. . |

OTHER PUBLICATIONS

T. Hempel et al., "Needle–Like Crystallization of Ni Doped Amorphous Silicon Thin Films", *Solid State Communications*, vol. 85, No. 11, pp. 921–924, 1993.

R. Kakkad et al., "Crystallized Si films by low–temperature rapid thermal annealing of amorphous silicon," *J.Appl. Phys.*, 65(5), Mar. 1, 1989, pp. 2069–72.

G. Liu et al., "Polycrystalline silicon thin film transistors on Corning 7059 glass substrates using short time, low–temperature processing," *Appl. Phys. Lett.* 62(20), May 17, 1993, pp. 2554–2556.

G. Liu et al., "Selective area crystallization of amorphous silicon films by low–temperature rapid thermal annealing," *Appl. Phys. Lett.* 55(7), Aug. 14, 1989, pp. 660–662.

R. Kakkad et al., "Low Temperature Selective Crystallization of Amorphous Silicon," *Journal of Non–Crystalline Solids*, 115, 1989, pp. 66–68.

Y. Kawazu et al., Jpn J. Appl. Phys., vol. 29, No. 12, pp. 2698–2704, "Low–Temperature Crystallization of Hydrogenated Amorphous Silicon Induced by Nickel Silicide Formation", Dec. 1990.

J.T. Mayer et al., Surface Science, vol. 265, pp. 102–110, "Surface and Bulk Diffusion of Adsorbed Nickel on Ultrathin Thermally Grown Silicon Dioxide", 1992.

M. Morita et al., Appl. Phys. Lett., vol. 49, No. 12, pp. 699–700, "Fluorine–enhanced Photo–Oxidation of Silicon under ArF Excimer Laser Irradiation in an $O_2$ + $NF_3$ Gas Mixture", Sep. 22, 1986.

M. Morita et al., Jpn. J. Appl. Phys., vol. 29, No. 12, pp. 2392–2394, "Native Oxide Growth on Silicon Surface in Ultrapure Water and Hydrogen Peroxide", Dec. 1990.

R. Anton, Thin Solid Films, vol. 118, p. 293–311, "Interaction of Gold, Palladium and Au–Pd Alloy Deposits with Oxidized Si(100) Substrates", Jun. 26, 1984.

S. Wolf et al., "silicon Processing for the VLSI Era", vol. 1, pp. 516–517, 1986.

M. Meuris et al., Jpn, J. Appl. Phys., vol. 31, Part 2, no. 11A, L1514–L1517, "The Relationship of the Silicon Surface Roghness and Gate Oxide Integrity in $NH_4OH/H_2O_2$ Mixtures", Nov. 1, 1992.

J. Stoemnos et al., Appl. Phys. Lett., vol. 58, No. 11, pp. 1196–1198, "Crystallization of Amorphous silicon by Reconstructive Transformation Utilizing Gold", Mar. 18, 1991.

R.J. Nemanich et al., Phys. Rev. B, vol. 23, No. 12, "Structure and Growth of the Interface of Pd on a–Si:H", pp. 6828–6832, Jun. 15, 1981.

M.J. Thompson et al., Appl. Phys. Lett., vol. 39, No. 3, "Silicide Formation in Pd–a–Si:H Schottky Barriers", pp. 274–277, Aug. 1, 1981.

R.J. Nemanich et al., Mat. Res. Soc. Symp. Proc., vol. 25, "Initial Phase Formation at the Interface of Ni, Pd, or Pt and Si", 6 pages, 1984.

LASER LIGHT IRRADIATION

BORON ION IMPLANTATION

FIG. 3B

PHOSPHORUS ION IMPLANTATION

FIG. 3C

THIN FILM TRANSISTOR ARRANGED IN PERIPHERAL DRIVING CIRCUIT REGION

THIN FILM TRANSISTOR ARRANGED IN PIXEL REGION

METHOD OF MANUFACTURING SEMICONDUCTOR DEVICE

This application is a continuation-in-part of U.S patent application Ser. No. 08/350,114, filed Nov. 29, 1994, now U.S. Pat. No. 5,585,291.

BACKGROUND OF THE INVENTION

1. Field of the Invention

The present invention relates to a method of manufacturing an electro-optic device represented by a liquid crystal display, to a method of manufacturing a semiconductor device available to the construction of the liquid crystal display, and to a method of selectively forming a thin-film device which is different in its characteristics.

2. Description of the Related Art

In recent years, there have been known liquid-crystal displays using a thin-film transistor. This is called an active matrix type in which thin-film transistors are disposed in a plurality of pixels that are arranged in the form of a matrix, respectively, so as to control the storage and discharge of an electric charge held in a pixel electrode of each pixel. The active matrix type liquid-crystal display has been expected to be used as a main one in the display field in the future because it is capable of displaying a fine and high-speed moving picture.

Also, there have been known the active matrix type liquid-crystal display of a construction in which a thin-film transistor disposed in a pixel region and a thin-film transistor constituting a peripheral driver circuit for driving the pixels are formed on the same substrate. With the application of such a construction, the pixel region and the peripheral driver circuit are capable of being integrated as a thin-film integrated circuit on one substrate, to thereby remarkably promote the weight-lighting and thinning of the liquid crystal display.

In general, the required characteristics are different between the thin-film transistor disposed in the pixel region and the thin-film transistor disposed in the peripheral driver circuit. The thin-film transistor disposed in the pixel region is required to have a small off-current (also called "leak current"). The "off-current" of the thin-film transistor is directed to a current which is allowed to flow between a source and drain of the thin-film transistor in a state where the thin-film transistor is off. The "large off-current" causes the electric charge to flow out as the off-current without being held in the pixel electrode regardless of the thin-film transistor being off, thereby coming into a state in which an image display cannot be conducted in a required period of time.

On the other hand, the thin-film transistor disposed in the peripheral driver circuit is required to have a characteristic that enables a large on-current to flow, and also enables a high-speed operation to be conducted. In other words, it is required to provide a high mobility. The thin-film transistor disposed in the pixel region is not required to provide the high mobility because it is not required to conduct a high-speed operation so much.

In this way, the thin-film transistor disposed in the pixel region and the thin-film transistor disposed in the peripheral driver circuit are required to provide a different characteristic, respectively. Therefore, in the case of integrating on the same substrate the thin-film transistor disposed in the pixel region and the thin-film transistor disposed in the region of the peripheral driver circuit, a thin-film transistor having a required characteristic need be selectively formed in a required region through a devised manufacture process.

SUMMARY OF THE INVENTION

The present invention has been made in view of the above, and an object of the invention is to provide a technique by which thin-film transistors each having a different characteristic are distinguishably formed on the same substrate.

Another object of the invention is to provide a technique by which the thin-film transistor disposed in the pixel region and the thin-film transistor for constituting the peripheral driver circuit are distinguishably formed on the same substrate, in a method of manufacturing an active matrix type liquid-crystal display.

In order to perform the foregoing object, according to the present invention, there is provided a method of manufacturing a semiconductor device, which comprises the steps of: forming an amorphous silicon film; forming a thin film having a translucent property that contains a metal element that promotes the crystallization of silicon on a part of said amorphous silicon film; crystallizing the amorphous silicon film in a region where the thin film having a translucent property is formed through a heat treatment; applying a laser light onto the amorphous silicon film.

In the foregoing method, the amorphous silicon film may be of a film having a thickness of several hundreds to several thousands Å which is formed on a substrate having an insulating surface through the plasma CVD technique, the decompression heat CVD technique or other known film forming techniques. The substrate having an insulating surface may be of a glass substrate, a quartz substrate, a substrate having an insulating film such as a silicon oxide film or a silicon nitride film formed on the surface of the glass substrate or quartz substrate, or a semiconductor substrate or conductive substrate having an insulating film formed thereon. In general, in the case of constituting a liquid crystal display, a translucent substrate represented by a glass substrate is utilized as the substrate.

In the foregoing method, the process of forming a thin film having a translucent property that contains a metal element that promotes the crystallization of silicon on a part of said amorphous silicon film is to selectively promote the crystallization of at least a part of the amorphous silicon film.

The metal element that promotes the crystallization of silicon may be a kind of element or plural kinds of elements which are selected from Fe, Co, Ni, Ru, Rh, Pd, Os, Ir, Pt, Cu or Au. More particularly, it has been found that nickel (Ni) is excellent in reproducibility and remarkable in effects. Also, those metal elements need to be introduced so that the concentration of the metal elements in the silicon film must be set to a range where the crystallization of silicon can be promoted and the characteristic as the silicon semiconductor is prevented from being lost, that is, set to $1\times10^{16}$ cm$^{-3}$ to $5\times10^{19}$ cm$^{-3}$, more preferably, to $1\times10^{17}$ cm$^{-3}$ to $5\times10^{19}$ cm$^{-3}$. More specifically, the concentration of the metal element in the thin film having the translucent property must be adjusted so that the concentration of the metal element in the silicon film is set to the above-mentioned range of concentration.

In the foregoing method, the process of conducting a heat treatment is to selectively crystalize a part of the amorphous silicon film region by the action of the metal element that promotes the crystallization of silicon and has been introduced into that region. In general, the amorphous silicon film is subjected to a heat treatment so as to be crystallized. The temperature of crystallization of the amorphous silicon film is generally about 580° to 620° C., although it differs depending on the film formation method or film formation conditions.

In the heat treatment, with the use of the metal element that promotes the crystallization of silicon, the amorphous silicon film can be crystallized at a lower temperature and in a shorter period of time.

In the case where a metal element that promotes the crystallization of silicon is utilized, because a period of time which is necessary for heat treatment is shortened, the amorphous silicon film, into which the metal element that promotes the crystallization has not been introduced, is not generally crystallized. For example, when the heating temperature is 650° C., a heating time which is necessary for obtaining an excellent crystalline property is about 4 hours. However, the amorphous silicon film, in which a metal element that promotes the crystallization is not used, is not crystallized in this heat treatment condition.

According to the present invention, using the above fact, the foregoing heat treatment is conducted at a temperature, in which the amorphous silicon film is not crystallized, and the amorphous silicon film is selectively crystallized in only a region, into which the metal element that promotes the crystallization of silicon is introduced.

More specifically, the selective crystallization can be performed by conducting the heat treatment at a temperature of 450° C. or more. In general, in the case where a temperature is 600° C. or less, when the amorphous silicon film is to be crystallized, a time which is necessary for crystallization is 100 hours or more. In the present invention, the heating time can be reduced to ⅒ or less out of the conventional one because the metal element that promotes the crystallization of silicon is introduced. However, when the temperature is 450° C. or less, a time which is necessary for heat treatment is several tens hours or more, which is not practical.

Accordingly, in the present invention, the heat treatment is conducted at a temperature of 450° C. or more so that a region, into which the metal element that promotes the crystallization of silicon is introduced, is selectively crystallized.

Also, in the case where a glass substrate (including a quartz substrate) is used as a substrate, it is necessary that an upper limit of the foregoing temperature of the heat treatment is set to a strain point or less of the glass substrate. It is effective to conduct the heat treatment at a temperature which is as high as possible but is not higher than the strain point of the glass substrate. Therefore, according to the present invention, the heat treatment is conducted at a temperature which is not lower than 450° C. but not higher than the strain point of the glass substrate, to thereby selectively crystallize a region, into which a metal element that promotes the crystallization of silicon is introduced.

In the foregoing method, a region where the amorphous silicon film is crystallized, and a region where the amorphous silicon film remains as it is are formed simultaneously through the process of conducting the heat treatment. After the process of conducting the heat treatment has been completed, a first crystalline region, in which the crystalline property of the selectively crystallized region is further promoted, is formed by the irradiation of a laser light, and simultaneously the region where the amorphous silicon remains as it is crystallized into a second crystalline region.

It should be noted that a laser light may be selectively irradiated onto only a region that necessitates the laser light in the process of irradiating the laser light.

The first crystalline region has an extremely excellent crystalline property because it is crystallized by the heat treatment and the irradiation of a laser light. The second crystalline region is lower in crystalline property than the first crystalline region because it is crystallized by only the irradiation of a laser light. However, the second crystalline region has a crystal structure which is fine to the extend that a grain boundary is not remarkable. More particularly, with the irradiation of a laser light within a range of a low output which is stabilized, a crystalline silicon film low in trap level can be obtained with stability.

Since the second crystalline region is crystallized by only the irradiation of a laser light, the laser light must be irradiated with a large energy density. However, if the laser light is irradiated with such an energy density, because the first crystalline region has already been crystallized by heating, its crystal orientation may be damaged. Accordingly, the laser light must be irradiated onto the first region with an energy density of such a degree that the crystallization is promoted.

For that reason, according to the present invention, the laser light is irradiated through a translucent thin film which is used for introducing the metal element so that the density of irradiation energy of the laser light is reduced through the thin film. Therefore, because no translucent thin film is formed on the surface of the second region, a laser light is irradiated thereonto with an energy density that enables the crystallization. Simultaneously, because a translucent thin film is formed on the surface of the first region, a laser light can be irradiated thereonto with an energy density which is lower than that of the second region. In other words, a laser light can be irradiated in a region that necessitates the laser light with a required energy density in one process of irradiating a laser light.

Also, because a translucent thin film is formed on the surface of the first crystalline region in such a way that the surface thereof is pressed by the translucent thin film, the roughness of that surface which is caused when the laser light is irradiated thereonto can be restrained.

The thin film having the translucent property may be made of a material that transmits the laser light with a required transmittance. Such a thin film having the translucent property may be of a silicon oxide film. Also, the energy density of a laser light can be adjusted by adjusting the thickness of a translucent thin film and the concentration of an impurity which is added to a thin film to change the transmittance.

In the present invention with the foregoing processes, although the first crystalline silicon film obtained by using the metal element has an off-current value enlarged by an influence of the metal element that remains in the film, because it has a high crystalline property, a thin film transistor having a high mobility can be formed. Accordingly, for example, it can be properly used for the peripheral circuit of the active matrix type liquid-crystal display.

On the other hand, the second crystalline silicon film which has been crystallized by only the irradiation of a laser light is incomplete in crystalline property. Therefore, it is difficult to uniformly obtain a high mobility over the entire film. However, with the irradiation of a laser light within a range of a low output having a stabilized laser power, a crystalline silicon film low in trap level can be obtained with stability. Accordingly, because the crystalline silicon film, a mobility of which is sacrificed but which has a low off-current characteristic is obtained, it can be suitably used for, for example, a thin-film transistor which is disposed in the pixel region of the active matrix type liquid-crystal display.

Further, according to the present invention, as a structure that modifies the foregoing structure, there is provided a method of manufacturing a semiconductor device, which comprises the steps of: forming an amorphous silicon film; forming a thin film having a translucent property that contains a metal element that promotes the crystallization of silicon on a part of said amorphous silicon film; crystallizing the entire amorphous silicon through a heat treatment; applying a laser light onto at least a part of a region where said thin film having the translucent property has been formed and at least a part of a region where no thin film having the translucent property has been formed.

The foregoing method is characterized in that the heat treatment is conducted at a temperature not less than a temperature of crystallization of the amorphous silicon film for a predetermined period of time so as to crystallize the entire amorphous silicon film.

The upper limit of the heat treatment temperature is properly set to a strain point of a glass substrate if the glass substrate is used as a substrate.

In the foregoing process of conducting the heat treatment, the amorphous silicon film in a region which is in contact with a translucent thin film containing a metal element is changed into a first crystalline region with an excellent crystalline property. On the other hand, the amorphous silicon film in a region which is out of contact with a translucent thin film containing a metal element is changed into a second crystalline region a crystalline property of which is lower than that of the former. In other words, the crystalline regions different in crystalline property are selectively formed.

Still further, according to the present invention, there is provided a method of manufacturing a liquid-crystal display having a pixel region and a peripheral circuit region, said method comprising the steps of: forming an amorphous silicon film on a substrate having an insulating surface; forming a translucent thin film containing a metal element that promotes the crystallization of silicon on an amorphous silicon film in at least a part of said peripheral circuit region; crystallizing said amorphous silicon film in a region where said translucent thin film has been formed by conducting a heat treatment; applying a laser light; and forming a thin-film transistor using said silicon film onto which the laser light has been applied.

In the foregoing method, the thin-film transistor disposed in the peripheral circuit region (mainly a peripheral driver circuit region) of the active matrix type liquid-crystal display is crystallized by the action of a metal element, and a thin-film transistor is constituted by using a region (crystalline silicon film) where the crystallization has been promoted by the irradiation of a laser light before a thin-film transistor disposed in the pixel region is constituted by a region (crystalline silicon film) which has been crystallized by the irradiation of the laser light. It should be noted that the peripheral driver circuit includes an analog and digital circuits dealing with a video signal, etc., a memory and so on except for a literal driver circuit portion that drives the thin-film transistor of a pixel. In the case where there is no necessity of providing a high mobility for all the thin-film transistors constituting the peripheral circuit, it is unnecessary to introduce nickel elements into all the regions that constitutes the peripheral circuit.

Also, in the foregoing method, the entire amorphous silicon film may be crystallized by elevating the temperature of the heat treatment.

In the present invention having the foregoing structure, a translucent thin film containing a metal element that promotes the crystallization of silicon is formed on a part of the amorphous silicon film before being subjected to a heat treatment, thereby being capable of selectively crystallizing a part of regions. Further, with the irradiation of a laser light, the crystalline property of the crystallized region is further improved while the remaining amorphous region can be crystallized. In this way, regions of the crystalline silicon thin film having different electric characteristics can be formed. A thin-film transistor is constituted using the regions having those different electric characteristics whereby the thin-film transistor having a required electric characteristic can be selectively manufactured.

The thin-film transistor constituted using the region which is crystallized through the heat treatment by the action of the metal element that promotes the crystallization has a high mobility so as to enable a high-speed operation and enables a large on-current to flow. Also, the thin-film transistor constituted using a region which has been crystallized by only the irradiation of a laser light has no characteristics that allow the high-speed operation and the flowing of a large on-current, but can obtain the characteristic of a relatively low off-current.

Therefore, the thin-film transistors having the respective characteristics required for the peripheral driver circuit region and the pixel region can be formed on the same substrate simultaneously by constituting a thin-film transistor forming a peripheral driver circuit region of the active matrix type liquid crystal display using a region obtained by selectively introducing the metal element that promotes the crystallization of silicon and by constituting a thin-film transistor disposed in the pixel region using a region which has been crystallized by only the irradiation of a laser light.

Also, the translucent thin film has an action of introducing the metal element into the amorphous silicon film as well as an action of lowering an irradiation energy density of a laser light. For that reason, a laser light having a low energy density is irradiated onto a silicon film which has been crystallized through a heat treatment and exists under the translucent thin film whereas a laser light having a high energy density is irradiated onto a silicon film that remains amorphous as it is.

BRIEF DESCRIPTION OF THE DRAWINGS

The accompanying drawings, which are incorporated in and constitute a part of this specification, illustrate (an) embodiment(s) of the invention and, together with the description, serve to explain the objects, advantages and principles of the invention. In the drawings.

DETAILED DESCRIPTION OF THE PREFERRED EMBODIMENTS

A description will be given of embodiments of the present invention with reference to the accompanying drawings.

This embodiment shows a process of distinguishably manufacturing a thin-film transistor constituting a peripheral driver circuit and a thin-film transistor constituting a pixel region on the same glass substrate in the manufacture of an active matrix type liquid-crystal display.

Figure 1A:
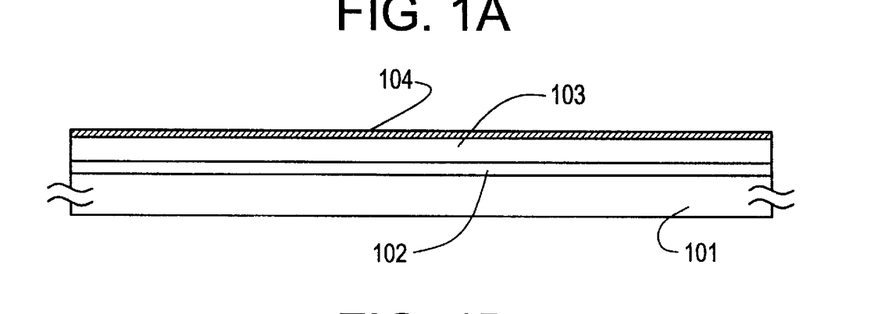
FIGS. 1A to 1D are diagrams showing a process of forming a crystalline silicon film on a glass substrate.

As shown in FIG. 1A, a silicon oxide film 102 having a thickness of 3,000 Å as an underlaid film is formed on a glass substrate 101. Then, an amorphous silicon film 103 having a thickness of 500 Å is formed thereon through the plasma CVD technique or the decompression heat CVD technique.

The glass substrate 101 may be of a Corning 7059 glass substrate (a strain point of 593° C.), a Corning 1737 glass substrate (a strain point of 667° C.) or a Corning 7940 quartz glass (a strain point of 990° C.).

Further, an extreme thin oxide film 104 forming a barrier film with a thickness of about 100 Å is formed on the amorphous silicon film 103 through the UV oxidizing technique. The UV oxidizing technique is of a technique by which a UV light is irradiated in the oxidized atmosphere to form the extreme thin oxide film. The method of forming the oxide film 104 may be conducted through the heat oxidizing technique or the plasma CVD technique. The oxide film 104 functions as the barrier film to restrain the diffusion of the metal element that promotes the crystallization of silicon in a latter process (FIG. 1A).

Figure 1B:
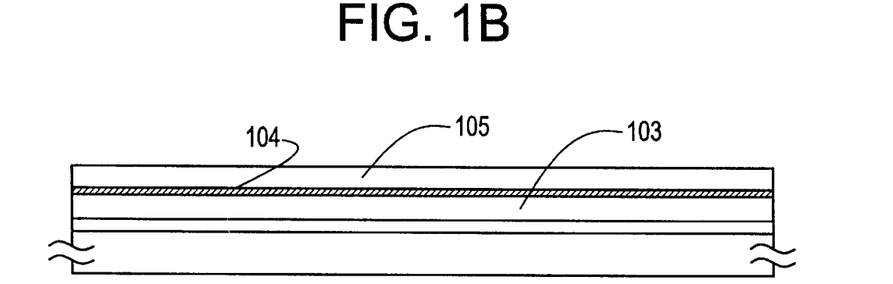

Subsequently, an OCD solution containing nickel elements therein is coated on the oxide film 104 through the spin coating technique and then subjected to a baking process at 200° C. for 30 minutes, to thereby form a silicon oxide film 105 containing nickel. In this baking process, the extreme thin oxide film 104 function as the barrier film, thereby preventing the nickel elements from being diffused into the amorphous silicon film 103 (FIG. 1B).

The "OCD solution" is directed to a coating solution for the formation of a silicon oxide based coating made by TOKYO OHKA KOGYO CO., LTD. Using the OCD solution, a silicon oxide film 105 containing nickel therein is formed on the film 104 so as to form a resist film.

The method of introducing the nickel elements using such a solution can hold the nickel elements (metal element) so as to be uniformly in contact with (or in indirect contact with) the amorphous silicon film 103. Therefore, such a method is effective in the uniform crystal growth.

Figure 1C:
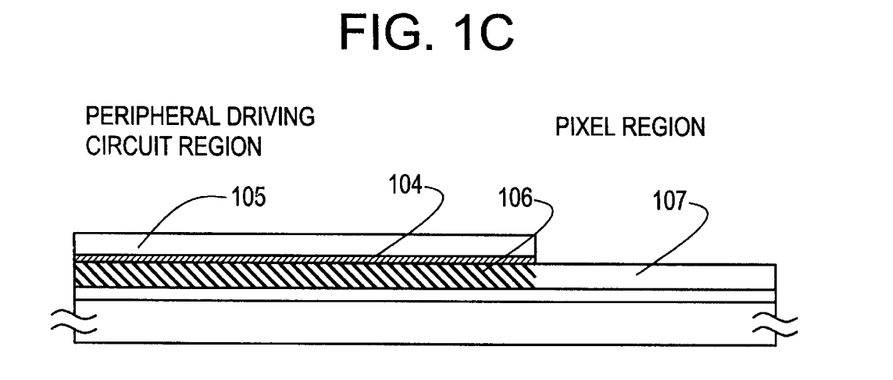

Thereafter, the silicon oxide film 105 containing nickel therein and the oxide film 104 are selectively removed using a buffer hydrofluoric acid having a lowered concentration. In this manner, a state shown in FIG. 1C is obtained. In this state, a region where the silicon oxide film 105 containing nickel therein remains comes into a region where a thin-film transistor disposed in the peripheral driver circuit is formed. On the other hand, a region from which the silicon oxide film 105 has been removed comes into a region where a thin-film transistor disposed in the pixel region is formed.

After a state shown in FIG. 1C has been obtained, a heat treatment is conducted to crystalize the amorphous silicon film 103. This heat treatment is conducted at 550° C. for four hours. In the process of the heat treatment, nickel transmits the oxide film 104 from the silicon oxide film 105 containing nickel therein before being diffused into the amorphous silicon film 103, and the amorous silicon film 106 is crystallized by the action of nickel into a crystalline silicon film 106. On the other hand, the amorphous silicon film 107 is not crystallized in the condition of that heat treatment process.

The heat treatment process must be conducted at a temperature of from 450° to 600° C. When the temperature is not higher than 450° C., the amorphous silicon film 103 under the remaining silicon oxide film 105 cannot be crystallized. Also, when the heat treatment is conducted at a temperature not lower than 600° C., the entire amorphous silicon film 103 is crystallized. If the entire amorphous silicon film 103 is crystallized, then the object for manufacturing the thin-film transistor selectively having the different characteristics could not been achieved.

Figure 1D:
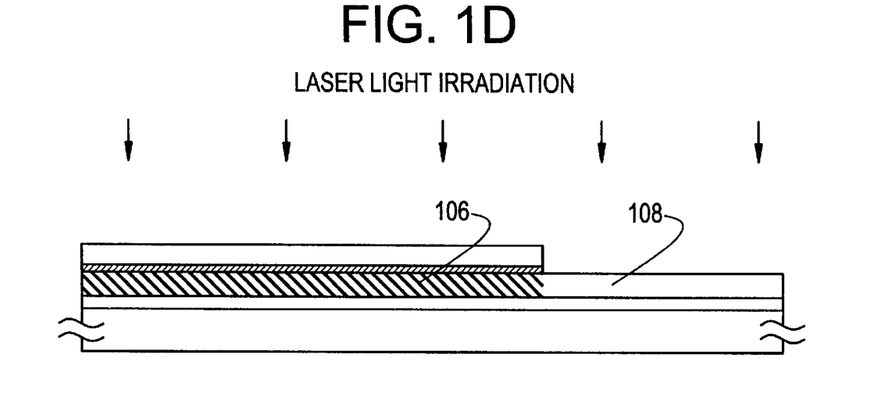

After the heat treatment process has been completed, the KrF excimer laser light (a wavelength of 248 mm) is irradiated so that the amorphous silicon film 107 is crystallized by the action of a laser light into a crystalline silicon film 108 in this process. On the other hand, a laser light is irradiated onto the crystalline silicon film 106 after transmitting the oxide film 104 and the silicon oxide film 105, thereby more promoting its crystalline property.

In this situation, since the surface of the crystalline silicon film 106 is pressed by the oxide film 104 and the silicon oxide film 105, the formation of the roughness on its surface can be restrained. On the other hand, although the roughness is formed even on the surface of the crystalline silicon film 108, since no nickel element that promotes the crystallization of silicon is introduced into the crystalline silicon film 108, the remarkable roughness of such a degree as to cause any problem is not formed.

For obtaining the crystalline silicon films 106 and 108, the optimum density of irradiation energy of a laser light is different. The optimum value of that irradiation energy density depends on the film thickness, the film quality and also the kinds of the film forming method or the kinds of a laser light. In this embodiment, the optimum irradiation energy density is about 310 to 320 $MJ/cm^2$ in order to promote the crystallization of the crystalline silicone film 106, and about 360 to 390 $mJ/cm^2$ in order to form the crystalline silicon film 108.

Also, in that process, a laser light can be irradiated onto the regions 106 and 108 with the respective proper irradiation energy densities because of the existence of the silicon oxide film 105.

In this situation, in a state shown in FIG. 1C, when a laser light having an irradiation energy density of 360 to 390 $mJ/cm^2$ is irradiated onto the amorphous silicon film 107, the amorphous silicon film 107 is crystallized in a nearly optimum condition and comes into a crystalline silicon film 108. On the other hand, a laser light an energy density of which is attenuated to the degree of 310–320 $mJ/cm^2$ through the silicon oxide film 105 is irradiated onto the crystalline silicon film 106. To realize such a nearly optimum condition, the transmittance of the silicon oxide film 105 to the wavelength of a laser light, that is, the conditions of the thickness or quality of the film need to be determined.

The crystalline silicon films 106 and 108 can be obtained by the irradiation of a laser light in the nearly optimum condition.

However, the movement of carriers via a grain boundary exists in the crystalline silicon film 106 because nickel is segregated in the grain boundary. The movement of carriers via the grain boundary causes a leak current at the time of an off-state of the thin-film transistor. For that reason, the thin-film transistor constituting an active layer using the crystalline silicon film 106 has the off-current characteristic lowered. However, since the crystalline silicon film 106 has an excellent crystalline property, a thin-film transistor that can allow a larger on-current to flow and perform a high-speed operation.

The crystalline silicon film 108 is lower in crystalline property than the crystalline silicon film 106, however, the existence of the grain boundary is not remarkable and the quality of the film is fine. Also, the movement of the carrier moving via the grain boundary is not so remarkable. Therefore, the thin-film transistor constituting an active layer using the crystalline silicon film 108 cannot provide a large mobility and perform a high-speed operation, but can make the off-current characteristic excellent.

Figure 2A:
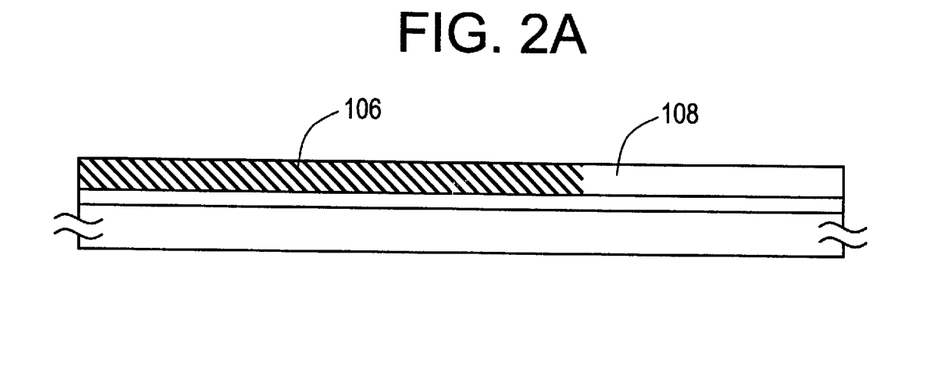
FIGS. 2A to 2C are diagrams showing a process of manufacturing a thin-film transistor.

The remaining silicon oxide film 105 and oxide film 104 are removed using a buffer hydrofluoric acid to thereby obtain a state shown in FIG. 2A.

Figure 2B:
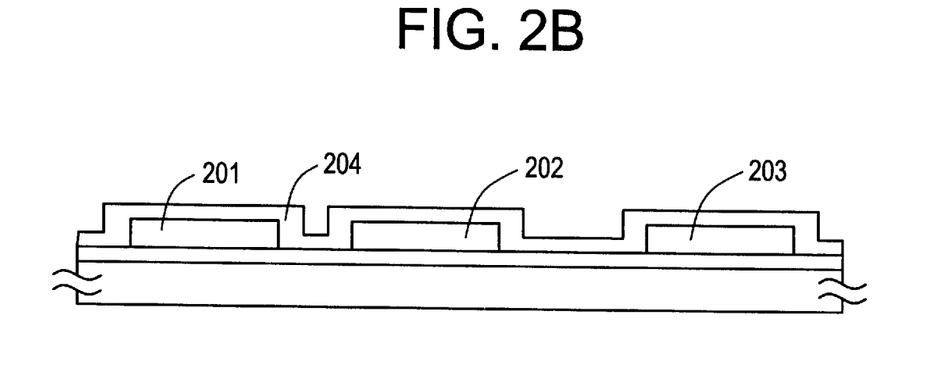

Subsequently, the crystalline silicon film 106 crystallized by heating and the irradiation of a laser light by the action of nickel and the crystalline silicon film 108 crystallized by the irradiation of a laser light are patterned, respectively, to thereby form active layers 201, 202 and 203 of the thin-film transistor as shown in FIG. 2B. The active layers 201 and 202 are comprised of the crystalline silicon film 106 crystallized by the action of nickel to form an active layer of the thin-film transistor disposed in the peripheral driver circuit. On the other hand, the active layer 203 is constituted by a crystalline silicon film 108 crystallized by only the irradiation of a laser light to thereby form an active layer of the thin-film transistor disposed in the pixel region. Further, a silicon oxide film 204 forming a gate insulating film with a thickness of 1,000 Å is formed on the surface of those active layers 201 to 203 (FIG. 2B).

Thereafter, a film that mainly contains aluminum with scandium and has a thickness of 6000 Å is formed by the electron beam vapor deposition technique and then patterned to thereby form gate electrodes 205 to 207 which mainly contain aluminum. Then, it is subjected to anodic oxidation with anodes of gate electrodes 205 to 207 in an electrolyte to thereby form an oxide layers 208 to 210 having a thickness of 2,000 Å. The oxide layers 205 to 207 serve as masks in the impurity ion process which is conducted later and functions to form an offset gate region (FIG. 2C).

Figure 2C:
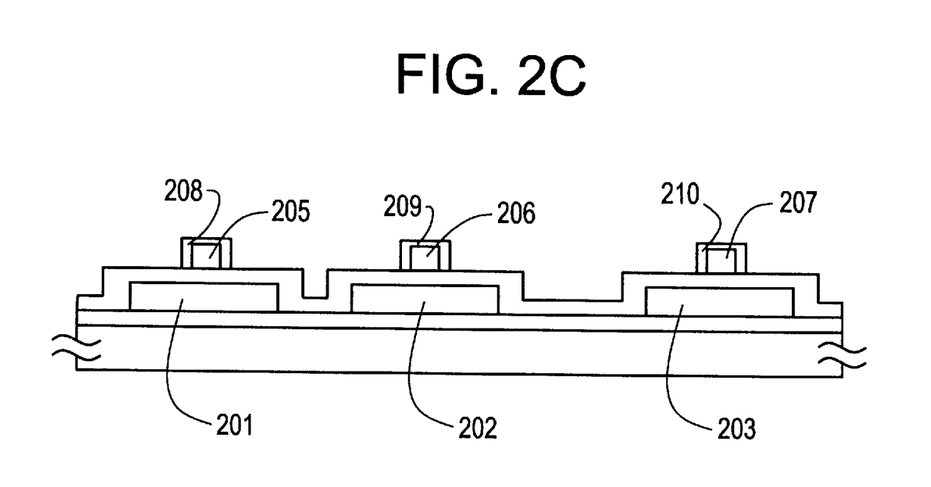
Figure 3A:
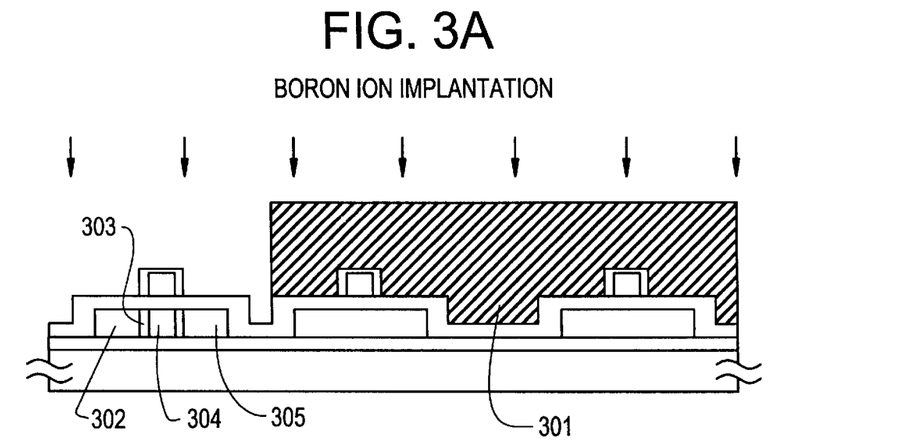
FIGS. 3A to 3C are diagrams showing a process of manufacturing a thin-film transistor.

Further, after obtaining a state shown in FIG. 2C, as shown in FIG. 3A, a resist mask 301 is formed so as to cover the active layers 202 and 203 before boron ions are injected into the active layer 201. In this process, the source and drain regions 302 and 305 of the $p^+$ type, the channel formation region 304 and the offset gate region 303 are formed in the self-alignment manner.

Figure 3B:
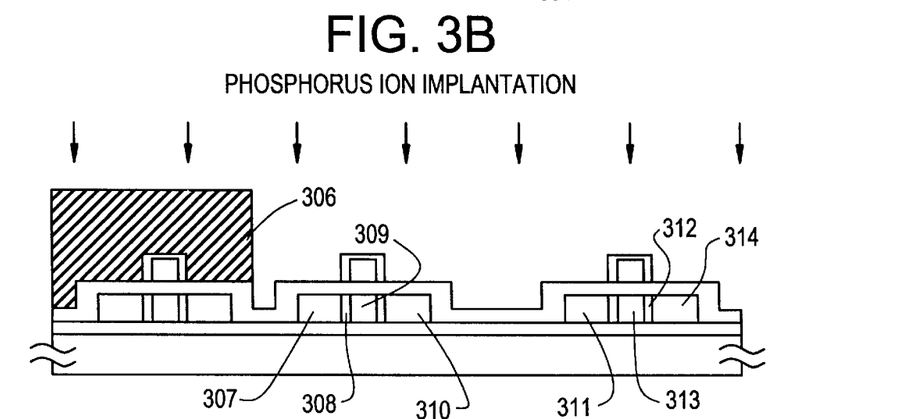

Subsequently, the resist mask 301 is removed therefrom before a resist mask 306 are formed so as to cover the active layer 201. With the injection of phosphorus ions into the active layers 202 and 203, source regions 310 and 311 of the $n^+$ type, drain regions 307 and 314, channel formation regions 309 and 313, and offset gate regions 308 and 312 are formed in the self-alignment manner. Thereafter, the resist mask 306 is removed therefrom and a laser light is irradiated onto the entire substrate so that the source regions 302, 310 and 311 and the drain regions 305, 307 and 314 are activated (FIG. 3B).

Figure 3C:
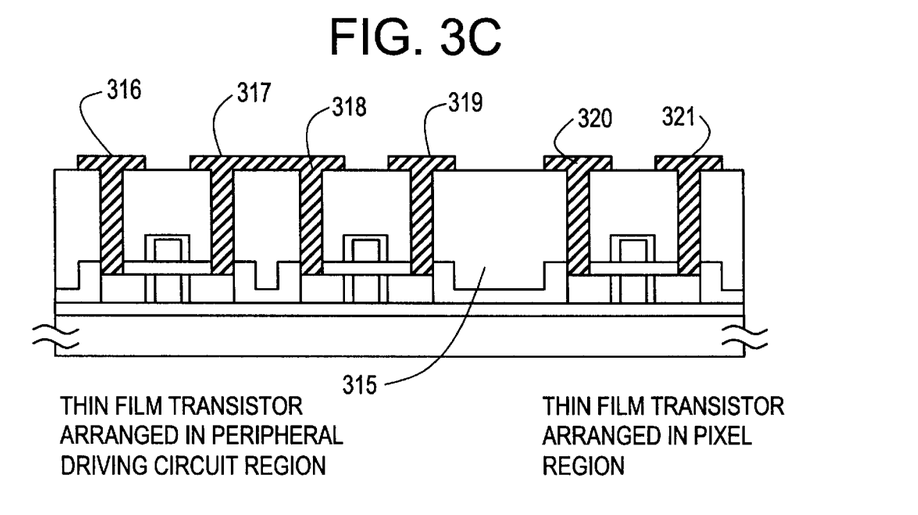

An oxide silicon film 315 are formed as an inter-layer insulating film through the plasma CVD technique. Further, with the formation of contact holes, p-channel source and drain electrodes 316 and 317 of the thin-film transistor, n-channel source electrodes 319 and 320 of the thin-film transistor, and the drain electrodes 318 and 321 are formed. In this structure, the drain electrodes 317 and 318 are connected to each other, and the CMOS structure constituting a peripheral driver circuit is formed.

In the foregoing manner, the thin-film transistor disposed in the peripheral driver circuit and the thin-film transistor disposed in the pixel region are formed simultaneously.

A translucent thin film containing a metal element that promotes the crystallization of silicon is formed on the surface of amorphous silicon film before being subjected to a heat treatment, and then a laser light is irradiated onto the translucent thin film, whereby a thin-film transistor having a required characteristic can be selectively formed in a required region. Using this technique, the thin-film transistors disposed in the peripheral circuit region and pixel region of the active matrix type liquid-crystal display can be formed so as to have required characteristics, respectively.

The foregoing description of preferred embodiments of the invention have been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a semiconductor device comprising the steps of:

forming a semiconductor film comprising silicon on an insulating surface;

forming a translucent film including a metal element on a first portion of said semiconductor film wherein said translucent film is not formed on a second portion of said semiconductor film, said metal element being capable of promoting crystallization of silicon;

selectively crystallizing said first portion of said semiconductor film by heating; and irradiating at least a part of said first portion of said semiconductor film and at least a part of said second portion of said semiconductor film with a light to promote further crystallization of said semiconductor film.

2. A method according to claim 1 wherein said translucent film is a silicon oxide film.

3. A method according to claim 1 wherein said translucent film transmits said light.

4. A method according to claim 1 wherein said metal element comprises at least a material selected from the group consisting of Fe, Co, Ni, Ru, Rh, Pd, Os, Ir, Pt, Cu and Au.

5. A method according to claim 1 wherein said semiconductor film includes said metal element at a concentration not higher than $5 \times 10^{19}$ cm$^{-3}$ therein.

6. A method according to claim 1 wherein said light is a laser light.

7. A method according to claim 1 wherein said semiconductor film includes said metal element at a concentration not lower than $1 \times 10^{16}$ cm$^{-3}$.

8. A method of manufacturing a semiconductor device comprising the steps of:

forming a semiconductor film comprising silicon on an insulating surface;

forming a translucent film including a metal element on a first portion of said semiconductor film, said metal element being capable of promoting crystallization of silicon;

crystallizing said first portion of said semiconductor film by heating at a temperature not higher than 600° C.; and irradiating said semiconductor film with a light to promote further crystallization thereof.

9. A method according to claim 8 wherein said translucent film is a silicon oxide film.

10. A method according to claim 8 wherein said translucent film transmits said light.

11. A method according to claim 8 wherein said metal element comprises at least a material selected from the group consisting of Fe, Co, Ni, Ru, Rh, Pd, Os, Ir, Pt, Cu and Au.

12. A method according to claim 8 wherein said semiconductor film includes said metal element at a concentration not higher than $5\times10^{19}$ cm$^{-3}$ therein.

13. A method according to claim 9 wherein said light is a laser light.

14. A method according to claim 8 wherein said semiconductor film includes said metal element at a concentration not lower than $1\times10^{16}$ cm$^{-3}$.

15. A method of manufacturing a semiconductor device comprising the steps of:
    forming a semiconductor film comprising silicon over a glass substrate;
    forming a translucent film including a metal element on a first portion of said semiconductor film, said metal element being capable of promoting crystallization of silicon;
    crystallizing said first portion of said semiconductor film by heating at a temperature not higher than 600° C.; and
    irradiating said semiconductor film with a light to promote further crystallization thereof.

16. A method according to claim 15 wherein said translucent film is a silicon oxide film.

17. A method according to claim 15 wherein said translucent film transmits said light.

18. A method according to claim 15 wherein said metal element comprises at least a material selected from the group consisting of Fe, Co, Ni, Ru, Rh, Pd, Os, Ir, Pt, Cu and Au.

19. A method according to claim 15 wherein said semiconductor film includes said metal element at a concentration not higher than $5\times10^{19}$ cm$^{-3}$ therein.

20. A method according to claim 15 wherein said light is a laser light.

21. A method according to claim 15 wherein said semiconductor film includes said metal element at a concentration not lower than $1\times10^{16}$ cm$^{-3}$.

22. A method of manufacturing a semiconductor device comprising the steps of:
    forming a semiconductor film comprising silicon over a glass substrate;
    forming a translucent film including a metal element on a first portion of said semiconductor film, said metal element being capable of promoting crystallization of silicon;
    crystallizing said semiconductor film by heating at a temperature not lower than a temperature of crystallization of said semiconductor film but not higher than 600° C.; and
    irradiating said semiconductor film with a light to promote further crystallization thereof.

23. A method according to claim 22 wherein said translucent film is a silicon oxide film.

24. A method according to claim 22 wherein said translucent film transmits said light.

25. A method according to claim 22 wherein said metal element comprises at least a material selected from the group consisting of Fe, Co, Ni, Ru, Rh, Pd, Os, Ir, Pt, Cu and Au.

26. A method according to claim 22 wherein said semiconductor film includes said metal element at a concentration not higher than $5\times10^{19}$ cm$^{-3}$ therein.

27. A method according to claim 22 wherein said light is a laser light.

28. A method according to claim 22 wherein said semiconductor film includes said metal element at a concentration not lower than $1\times10^{16}$ cm$^{-3}$.

29. A method of manufacturing a semiconductor device comprising the steps of:
    forming a semiconductor film comprising silicon on an insulating surface;
    forming a translucent film including a metal element on a first portion of said semiconductor film while said translucent film is not formed on a second portion of said semiconductor film, said metal element being capable of promoting crystallization of silicon;
    crystallizing said first portion of said semiconductor film by heating; and
    irradiating said semiconductor film with a light;
    wherein said first portion of said semiconductor film is further promoted crystallization and said second portion of said semiconductor film is crystallized in said irradiating step.

30. A method according to claim 29 wherein said translucent film is a silicon oxide film.

31. A method according to claim 29 wherein said translucent film transmits said light.

32. A method according to claim 29 wherein said metal element comprises at least a material selected from the group consisting of Fe, Co, Ni, Ru, Rh, Pd, Os, Ir, Pt, Cu and Au.

33. A method according to claim 29 wherein said semiconductor film includes said metal element at a concentration not higher than $5\times10^{19}$ cm$^{-3}$ therein.

34. A method according to claim 29 wherein said light is a laser light.

35. A method according to claim 29 wherein said semiconductor film includes said metal element at a concentration not lower than $1\times10^{16}$ cm$^{-3}$.

36. A method of manufacturing a semiconductor device comprising the steps of:
    forming a semiconductor film comprising silicon on an insulating surface;
    forming a translucent film including a metal element on a first portion of said semiconductor film, said metal element being capable of promoting crystallization of silicon;
    crystallizing said first portion of said semiconductor film by heating; and
    irradiating said semiconductor film with a light through said translucent film to promote further crystallization of said semiconductor film.

37. A method according to claim 36 wherein said translucent film is a silicon oxide film.

38. A method according to claim 36 wherein said translucent film transmits said light.

39. A method according to claim 36 wherein said metal element comprises at least a material selected from the group consisting of Fe, Co, Ni, Ru, Rh, Pd, Os, Ir, Pt, Cu and Au.

40. A method according to claim 36 wherein said semiconductor film includes said metal element at a concentration not higher than $5\times10^{19}$ cm$^{-3}$ therein.

41. A method according to claim 36 wherein said light is a laser light.

42. A method according to claim 36 wherein said semiconductor film includes said metal element at a concentration not lower than $1\times10^{16}$ cm$^{-3}$.

43. A method of manufacturing an active matrix type liquid-crystal display having a pixel region and a peripheral circuit region therein, said method comprising the steps of:
forming a semiconductor film comprising silicon on an insulating surface;
forming a translucent film containing a metal element on at least a first portion of said semiconductor film in said peripheral circuit region, said metal element being capable of promoting crystallization of silicon;
crystallizing said first portion of said semiconductor film by heating;
irradiating said semiconductor film with a light to promote further crystallization thereof; and
forming a thin-film transistor using said semiconductor film.

44. A method according to claim 43 wherein said translucent film is a silicon oxide film.

45. A method according to claim 43 wherein said translucent film transmits said light.

46. A method according to claim 43 wherein said metal element comprises at least a material selected from the group consisting of Fe, Co, Ni, Ru, Rh, Pd, Os, Ir, Pt, Cu and Au.

47. A method according to claim 43 wherein said semiconductor film includes said metal element at a concentration not higher than $5\times10^{19}$ cm$^{-3}$ therein.

48. A method according to claim 43 wherein said light is a laser light.

49. A method according to claim 43 wherein said semiconductor film includes said metal element at a concentration not lower than $1\times10^{16}$ cm$^{-3}$.

50. A method of manufacturing an active matrix type liquid-crystal display having a pixel region and a peripheral circuit region therein, said method comprising the steps of:
forming a semiconductor film comprising silicon on an insulating surface;
forming a translucent film containing a metal element on a first portion of said semiconductor film in said peripheral circuit region, said metal element being capable of promoting crystallization of silicon;
crystallizing said first portion of said semiconductor film by heating at a temperature not higher than 600° C.;
irradiating said semiconductor film with a light to promote further crystallization thereof; and
forming a thin-film transistor using said semiconductor film.

51. A method according to claim 50 wherein said translucent film is a silicon oxide film.

52. A method according to claim 50 wherein said translucent film transmits said light.

53. A method according to claim 50 wherein said metal element comprises at least a material selected from the group consisting of Fe, Co, Ni, Ru, Rh, Pd, Os, Ir, Pt, Cu and Au.

54. A method according to claim 50 wherein said semiconductor film includes said metal element at a concentration not higher than $5\times10^{19}$ cm$^{-3}$ therein.

55. A method according to claim 50 wherein said light is a laser light.

56. A method according to claim 50 wherein said semiconductor film includes said metal element at a concentration not lower than $1\times10^{16}$ cm$^{-3}$.

57. A method of manufacturing an active matrix type liquid-crystal display having a pixel region and a peripheral circuit region therein, said method comprising the steps of:
forming a semiconductor film comprising silicon over a glass substrate;
forming a translucent film containing a metal element on a first portion of said semiconductor film in said peripheral circuit region, said metal element being capable of crystallization of silicon;
crystallizing said first portion of said semiconductor film by heating at a temperature not lower than a temperature of crystallization of said semiconductor film but not higher than 600° C.;
irradiating said semiconductor film with a light to promote further crystallization thereof; and
forming a thin-film transistor using said semiconductor film.

58. A method according to claim 57 wherein said translucent film is a silicon oxide film.

59. A method according to claim 57 wherein said translucent film transmits said light.

60. A method according to claim 57 wherein said metal element comprises at least a material selected from the group consisting of Fe, Co, Ni, Ru, Rh, Pd, Os, Ir, Pt, Cu and Au.

61. A method according to claim 57 wherein said semiconductor film includes said metal element at a concentration not higher than $5\times10^{19}$ cm$^{-3}$ therein.

62. A method according to claim 57 wherein said light is a laser light.

63. A method according to claim 57 wherein said semiconductor film includes said metal element at a concentration not lower than $1\times10^{16}$ cm$^{-3}$.

64. A method of manufacturing an active matrix type liquid-crystal display having a pixel region and a peripheral circuit region therein, said method comprising the steps of:
forming a semiconductor film comprising silicon over a glass substrate;
forming a translucent film containing a metal element on a first portion of said semiconductor film in said peripheral circuit region, said metal element being capable of promoting crystallization of silicon;
crystallizing said first portion of said semiconductor film by heating at a temperature not higher than 600° C.;
irradiating said semiconductor film with a light to promote further crystallization thereof; and
forming a thin-film transistor using said semiconductor film.

65. A method according to claim 64 wherein said translucent film is a silicon oxide film.

66. A method according to claim 64 wherein said translucent film transmits said light.

67. A method according to claim 64 wherein said metal element comprises at least a material selected from the group consisting of Fe, Co. Ni, Ru, Rh, Pd, Os, Ir, Pt, Cu and Au.

68. A method according to claim 64 wherein said semiconductor film includes said metal element at a concentration not higher than $5\times10^{19}$ cm$^{-3}$ therein.

69. A method according to claim 64 wherein said light is a laser light.

70. A method according to claim 64 wherein said semiconductor film includes said metal element at a concentration not lower than $1\times10^{16}$ cm$^{-3}$.

* * * * *